United States Patent [19]

Uga et al.

[11] Patent Number: 5,319,234
[45] Date of Patent: Jun. 7, 1994

[54] C-BICMOS SEMICONDUCTOR DEVICE

[75] Inventors: Kimiharu Uga; Hiroki Honda; Masahiro Ishida; Yoshiyuki Ishigaki, all of Itami, Japan

[73] Assignee: Mitsubishi Denki Kabushiki Kaisha, Tokyo, Japan

[21] Appl. No.: 916,666

[22] Filed: Jul. 22, 1992

[30] Foreign Application Priority Data

Feb. 17, 1992 [JP] Japan ................. 4-029555

[51] Int. Cl.⁵ ........................................... H01L 27/02
[52] U.S. Cl. ............................... 257/369; 257/370; 257/378; 257/552
[58] Field of Search .............. 257/368, 370, 378, 49, 257/66, 67, 69, 552, 369

[56] References Cited

U.S. PATENT DOCUMENTS

| | | | |
|---|---|---|---|
| 4,887,142 | 12/1989 | Bertotti et al. | 257/370 X |
| 4,902,640 | 2/1990 | Sachitano et al. | 437/57 |
| 5,001,073 | 3/1991 | Huie | 257/370 X |
| 5,014,106 | 5/1991 | Maeda et al. | 257/370 X |
| 5,091,760 | 2/1992 | Maeda et al. | 357/23.4 |
| 5,107,321 | 4/1992 | Ilderem et al. | 257/274 |
| 5,119,162 | 6/1992 | Todd et al. | 257/370 |
| 5,179,036 | 1/1993 | Matsumoto | 257/378 X |
| 5,231,042 | 7/1993 | Ilderem et al. | 437/44 |
| 5,239,270 | 8/1993 | Desbiens | 324/719 |

FOREIGN PATENT DOCUMENTS

| | | |
|---|---|---|
| 0325181 | 7/1989 | European Pat. Off. . |
| 60-72255 | 4/1985 | Japan ..................... 257/378 |
| 0348457 | 3/1991 | Japan . |
| 348457 | 3/1991 | Japan . |
| WO90 16078 | 12/1990 | PCT Int'l Appl. . |
| 9016078 | 12/1990 | PCT Int'l Appl. . |

OTHER PUBLICATIONS

Kobayashi et al., "High Performance LSI Technology: SST CBi-CMOS", *IEDM*, 1988, pp. 760-763.

Maeda et al., "Lower Submicron FCBiMOS (Fully Complementary BiMOS) Process with RTP and MeV Implanted 5 GHz Vertical PNP Transistor," *IEEE 1990 Symposium on VLSI Technology*, 1990, pp. 79-80.

*Primary Examiner*—William Mintel
*Attorney, Agent, or Firm*—Oblon, Spivak, McClelland, Maier & Neustadt

[57] ABSTRACT

There is disclosed a C-BiCMOS semiconductor device in which a base electrode (300) of an NPN bipolar transistor and a drain electrode (360) of a PMOS transistor are formed of the same polycrystalline semiconductor, in which a base electrode (310) of a PNP bipolar transistor and a drain electrode (350) of an NMOS transistor are formed of the same polycrystalline semiconductor, and in which a source electrode (530) of the PMOS transistor and a source electrode (520) of the NMOS transistor are formed of aluminium wiring. The C-BiCMOS semiconductor device achieves preferable electric conductivity in the source electrodes, size reduction in the drain electrodes, and simplified process steps in the formation of the base electrodes of the bipolar transistors, so that the size of the devices is reduced in simple process steps without deterioration of the electric conductivity.

57 Claims, 21 Drawing Sheets

5,319,234

C-BICMOS SEMICONDUCTOR DEVICE

BACKGROUND OF THE INVENTION

1. Field of the Invention

The present invention relates to a semiconductor device and a method of fabricating the same and, more particularly, to a C-BiCMOS (Complementary-BiCMOS) semiconductor device.

2. Description of the Background Art

FIGS. 17 to 21 are cross-sectional views of a conventional BiCMOS semiconductor device in sequence of fabrication.

A p type silicon substrate 1 is prepared, and n type high concentration buried layers 2 and a p type high concentration buried layer 3 are formed in the p type silicon substrate 1. An n$^-$ type epitaxial layer 4 is grown over the top surface. Selective impurity implantation by means of a resist mask (not shown) and heat treatment are carried out to selectively form a p well layer 6 and an n well layer 5 in an upper surface of the epitaxial layer 4. The epitaxial layer 4 is left as it is in a region wherein a bipolar transistor is to be formed later.

An LOCOS (local oxidation of silicon) process is performed by means of a nitride film mask (not shown) to form isolating oxide films 100. Before the LOCOS process, impurities for a channel-cutting p+ diffusion layer to isolate transistors from each other, for example boron, are implanted to form channel cut layers 7. The isolating oxide films 100 are formed to cover the channel cut layers 7. A collector wall layer 8 is formed by implantation of n type impurities of high concentration and heat treatment as shown in FIG. 17.

Next, MOS transistors are fabricated in the process steps described below. Initially, an oxide film and a polyorystalline silicon film for gate electrodes are formed on the semiconductor surface. Thereafter, n type impurities of high concentration are introduced into the polycrystalline silicon film, and patterning is performed by means of a resist mask (not shown), so that gate oxide films 110 and gate electrodes 200 are formed. To form n$^-$ layers 9 for the LDD of an NMOS transistor, ions of n type impurities of low concentration are selectively implanted into the p well region 6. During the ion implantation process, a resist mask (not shown) covers the region wherein the bipolar transistor is to be formed or the epitaxial layer 4 and a region wherein a PMOS transistor is to be formed or the n well layer 5. An oxide film is formed all over. When dry etching is carried out all over, the oxide film is left only in gate side wall portions, so that side walls 120 are formed.

Subsequently, n type impurities of high concentration and p type impurities of high concentration are selectively implanted in series by means of a resist mask (not shown), and heat treatment is performed. This provides source-drain layers 10 of the NMOS transistor, the n$^-$ layers 9 for the LDD of the NMOS transistor, and source-drain layers 11 of the PMOS transistor. An oxide film 130 is then deposited all over, as shown in FIG. 18.

Next, process steps of fabricating the bipolar transistor are carried out. Initially, the oxide film 130 is selectively etched away by using a resist mask (not shown) until the surface of the epitaxial layer 4 is exposed. Polycrystalline silicon is formed all over. Ion implantation is performed with p type impurities of high concentration, and an oxide film is formed. At this time, the oxide film is deposited at low temperatures of below 500° C. so that the p type impurities are not diffused into the epitaxial layer 4 from the polycrystalline silicon.

By using a resist mask (not shown), the oxide film and polycrystalline silicon film are selectively removed by etching and are then patterned, to form base electrodes 210 and insulating layers 140 such that the epitaxial layer 4 is exposed.

The surface of the epitaxial layer 4 is thinly oxidized to form an oxide film 150. Ions of p type impurities for an intrinsic base are implanted into the epitaxial layer 4 through the oxide film 150. Heat treatment is succeedingly carried out to form external base layers 12 and an intrinsic base layer 13, as shown in FIG. 19.

An oxide film is formed all over, and dry etching is performed on the oxide film, whereby the intrinsic base layer 13 is exposed in a region 300. Emitter base electrode isolating oxide films 160 are formed on the intrinsic base layer 13, as shown in FIG. 20.

Layer insulating films 400 are deposited, and etched selectively to open via holes. By aluminium wiring are formed a collector electrode 500, an emitter extracting electrode 501, a base extracting electrode 502, a source extracting electrode 503 of the NMOS transistor, a drain extracting electrode 504 thereof, a source extracting electrode 505 of the PMOS transistor and a drain extracting electrode 506 thereof, as shown in FIG. 21.

In the conventional semiconductor device having the above-mentioned constructions, a portion in which an electrode connected to the source-drain layer is formed has a large size. The conventional semiconductor device, hence, has a problem in that it is difficult to reduce the size of the devices or transistors. To solve the problem, it has been proposed that the electrode connected to the source-drain layer is formed of a polycrystalline semiconductor. However, the connection of the polycrystalline semiconductor to both of the source and drain layers causes electric conductivity to deteriorate. The problem of more complicated process steps remains unsolved for a C-BiCMOS semiconductor device including a large number of different devices.

SUMMARY OF THE INVENTION

The present invention is intended for a method of fabricating a C-BiCMOS semiconductor device. According to the present invention, the method comprises the steps of: (a) forming a first semiconductor layer of a first conductivity type, a second semiconductor layer of a second conductivity type, a third semiconductor layer of the second conductivity type, and a fourth semiconductor layer of the first conductivity type in an upper surface of a substrate; (b) selectively forming a pair of fifth semiconductor layers of the first conductivity type in an upper surface of the third semiconductor layer to form a first MOS transistor including the fifth semiconductor layers serving as a pair of current electrodes; (c) selectively forming a pair of sixth semiconductor layers of the second conductivity type in an upper surface of the fourth semiconductor layer to form a second MOS transistor including the sixth semiconductor layers serving as a pair of current electrodes; (d) forming a first electrode extracting layer selectively contacting an upper surface of the second semiconductor layer and a second electrode extracting layer contacting an upper surface of one of the fifth semiconductor layers, the first and second electrode extracting layers consisting essentially of a polycrystalline semiconductor having a first impurity of the first conductivity type; (e) forming a third electrode extracting layer selectively contacting an upper surface of the first semiconductor layer and a fourth electrode extracting layer contacting an upper surface of one of the sixth semiconductor layers, the third and fourth electrode extracting layers consisting essentially of a polycrystalline semiconductor having a second impurity of the second conductivity type; (f) diffusing the first impurity from the first electrode extracting layer into the second semiconductor layer to form a seventh semiconductor layer of the first conductivity type selectively in the upper surface of the second semiconductor layer; (g) selectively forming an eighth semiconductor layer of the second conductivity type in an upper surface of the seventh semiconductor layer to form a first bipolar transistor including the second, seventh and eighth semiconductor layers; (h) diffusing the second impurity from the third electrode extracting layer into the first semiconductor layer to form a ninth semiconductor layer of the second conductivity type selectively in the upper surface of the first semiconductor layer: and (i) selectively forming a tenth semiconductor layer of the first conductivity type in an upper surface of the ninth semiconductor layer to form a second bipolar transistor including the first, ninth and tenth semiconductor layers.

In another aspect of the present invention, the method comprises the steps of: (a) forming a first semiconductor layer of a first conductivity type, a second semiconductor layer of a second conductivity type, a third semiconductor layer of the second conductivity type, and a fourth semiconductor layer of the first conductivity type in an upper surface of a substrate; (b) selectively forming a pair of fifth semiconductor layers of the first conductivity type in an upper surface of the third semiconductor layer to form a first MOS transistor including the fifth semiconductor layers serving as a pair of current electrodes; (c) selectively forming a pair of sixth semiconductor layers of the second conductivity type in an upper surface of the fourth semiconductor layer to form a second MOS transistor including the sixth semiconductor layers serving as a pair of current electrodes; (d) forming a seventh semiconductor layer of the second conductivity type in an upper surface of the first semiconductor layer; (e) forming an eighth semiconductor layer of the first conductivity type in an upper surface of the second semiconductor layer; (f) forming a first electrode extracting layer selectively contacting an upper surface of the seventh semiconductor layer and a second electrode extracting layer contacting an upper surface of one of the fifth semiconductor layers, the first and second electrode extracting layers consisting essentially of a polycrystalline semiconductor having a first impurity of the first conductivity type: (g) forming a third electrode extracting layer selectively contacting an upper surface of the eighth semiconductor layer and a fourth electrode extracting layer contacting an upper surface of one of the sixth semiconductor layers, the third and fourth electrode extracting layers consisting essentially of a polycrystalline semiconductor having a second impurity of the second conductivity type; (h) diffusing the first impurity from the first electrode extracting layer into the seventh semiconductor layer to selectively form a ninth semiconductor layer of the first conductivity type in the upper surface of the seventh semiconductor layer, to form a first bipolar transistor including the first, seventh and ninth semiconductor layers; and (i) diffusing the second impurity from the third electrode extracting layer into the eighth semiconductor layer to selectively form a tenth semiconductor layer of the second conductivity type in the upper surface of the eighth semiconductor layer to form a second bipolar transistor including the second, eighth and tenth semiconductor layers.

The present invention is also intended for a C-BiCMOS semiconductor device. According to the present invention, the C BiCMOS semiconductor device comprises: (a) a first semiconductor layer of a first conductivity type a second semiconductor layer of a second conductivity type, a third semiconductor layer of the second conductivity type, and a fourth semiconductor layer of the first conductivity type, the first to fourth semiconductor layers being formed in an upper surface of the same substrate; (b) a first MOS transistor including a pair of fifth semiconductor layers of the first conductivity type selectively formed in an upper surface of the third semiconductor layer and serving as a pair of current electrodes, a first electrode extracting layer consisting essentially of a polycrystalline semiconductor having a first impurity of the first conductivity type and contacting one of the fifth semiconductor layers, and a first conductor contacting the other fifth semiconductor layer; (c) a second MOS transistor including a pair of sixth semiconductor layers of the second conductivity type selectively formed in an upper surface of the fourth semiconductor layer and serving as a pair of current electrodes, a second electrode extracting layer consisting essentially of a polycrystalline semiconductor having a second impurity of the second conductivity type and contacting one of the sixth semiconductor layers, and a second conductor contacting the other sixth semiconductor layer; (d) a first bipolar transistor including a seventh semiconductor layer of the first conductivity type selectively formed in an upper surface of the second semiconductor layer, an eighth semiconductor layer of the second conductivity type selectively formed in an upper surface of the seventh semiconductor layer, and a third electrode extracting layer consisting essentially of the polyorystalline semiconductor having the first impurity and contacting the seventh semiconductor layer; and (e) a second bipolar transistor including a ninth semiconductor layer of the second conductivity type selectively formed in an upper surface of the first semiconductor layer, a tenth semiconductor layer of the first conductivity type selectively formed in an upper surface of the ninth semiconductor layer, and a fourth electrode extracting layer consisting essentially of the polycrystalline semiconductor having the second impurity and contacting the ninth semiconductor layer.

Preferably, the one fifth semiconductor layer is a drain, and the one sixth semiconductor layer is a drain.

In another aspect of the present invention, the C-BiCMOS semiconductor device comprises: (a) a first semiconductor layer of a first conductivity type, a second semiconductor layer of a second conductivity type, a third semiconductor layer of the second conductivity type, and a fourth semiconductor layer of the first conductivity type, the first to fourth semiconductor layers being formed in an upper surface of the same substrate; (b) a first MOS transistor including a pair of fifth semiconductor layers of the first conductivity type selectively formed in an upper surface of the third semiconductor layer and serving as a pair of current electrodes a first electrode extracting layer consisting essentially of a polycrystalline semiconductor having a first impurity of the first conductivity type and contacting one of the fifth semiconductor layers, and a first conductor contacting the other fifth semiconductor layer; (c) a second MOS transistor including a pair of sixth semiconductor layers of the second conductivity type selectively formed in an upper surface of the fourth semiconductor layer and serving as a pair of current electrodes, a second electrode extracting layer consisting essentially of a polycrystalline semiconductor having a second impurity of the second conductivity type and contacting one of the sixth semiconductor layers, and a second conductor contacting the other sixth semiconductor layer; (d) a first bipolar transistor including a seventh semiconductor layer of the second conductivity type selectively formed in an upper surface of the first semiconductor layer, an eighth semiconductor layer of the first conductivity type selectively formed in an upper surface of the seventh semiconductor layer, and a third electrode extracting layer consisting essentially of the polyorystalline semiconductor having the first impurity and contacting the eighth semiconductor layer; and (e) a second bipolar transistor including a ninth semiconductor layer of the first conductivity type selectively formed in an upper surface of the second semiconductor layer, a tenth semiconductor layer of the second conductivity type selectively formed in an upper surface of the ninth semiconductor layer, and a fourth electrode extracting layer consisting essentially of the polycrystalline semiconductor having the second impurity and contacting the tenth semiconductor layer.

Preferably, the one fifth semiconductor layer is a drain, and the one sixth semiconductor layer is a drain.

The base electrodes of the bipolar transistors and the drain electrodes of the MOS transistors are formed of the same polycrystalline semiconductor in the semiconductor device according to the first aspect of the present invention.

The emitter electrodes of the bipolar transistors and the drain electrodes of the MOS transistors are formed of the same polycrystalline semiconductor in the semiconductor device according to the second aspect of the present invention.

The source electrodes of the MOS transistors are formed of the conductor in the semiconductor device of the present invention.

The simplification of the process steps in forming the base or emitter electrodes of the bipolar transistors provides for the size reduction of the devices because the drain electrodes are made of the polycrystalline semiconductor. Since the drain electrodes and the base electrodes of the bipolar transistors are formed of the same polycrystalline semiconductor, the process steps are simplified. In addition, since the source electrodes of the MOS transistors are formed of the conductor, electric conductivity is not remarkably deteriorated.

An object of the present invention is to provide a C-BiCMOS semiconductor device and method of fabricating the same, which is capable of size reduction of devices in simple process steps without remarkable deterioration of electric conductivity.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
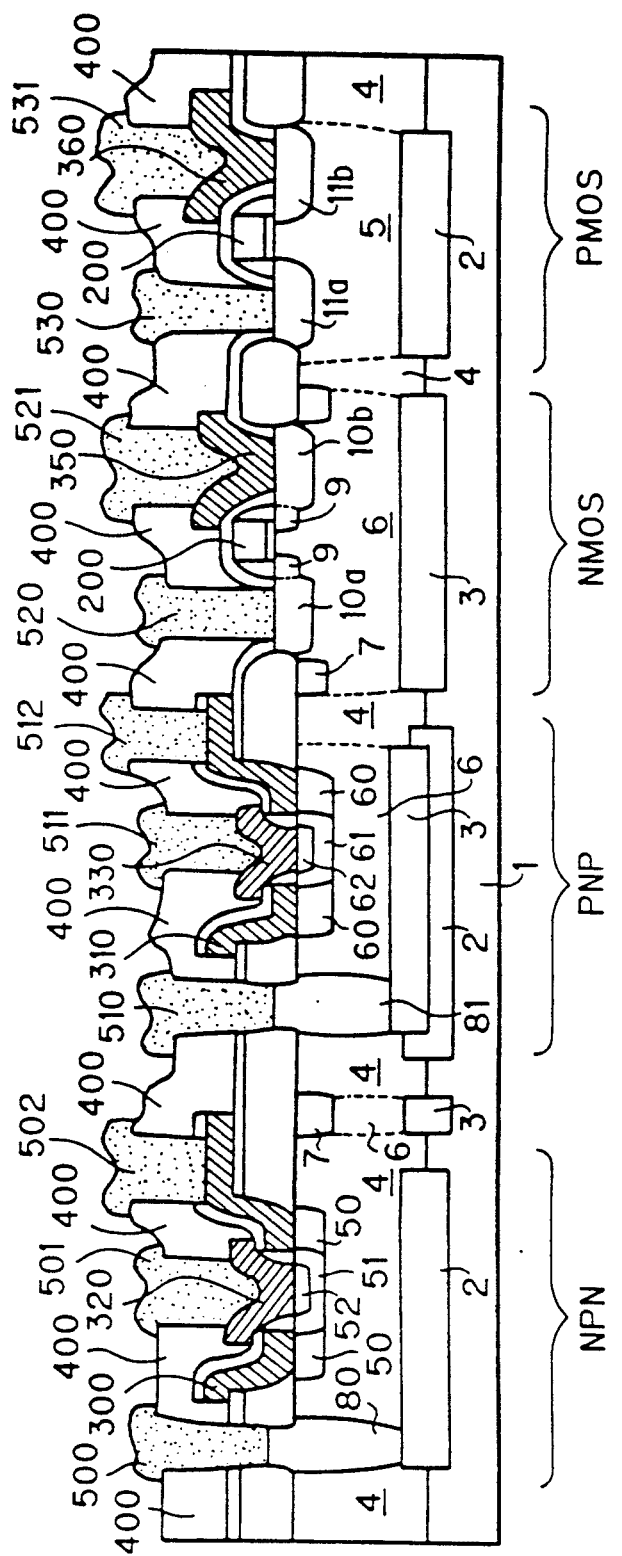
FIG. 1 is a cross sectional view of a C-BiCMOS semiconductor device according to a first preferred embodiment of the present invention.

FIG. 1 is a cross-sectional view of a C-BiCMOS semiconductor device according to a first preferred embodiment of the present invention.

FIGS. 2 to 9 are cross-sectional views showing a method of fabricating the C-BiCMOS semiconductor device of the first preferred embodiment in sequence of fabrication.

Description will now be given sequentially on the method of the first preferred embodiment with reference to FIGS. 2 to 9.

A p type silicon substrate 1 is prepared, and n type high concentration buried layers 2 and p type high concentration buried layers 3 are formed in series in the p type silicon substrate 1. One of the p type high concentration buried layers 3 is formed across an upper surface of the n type buried layer 2 provided in a region wherein a PNP transistor is to be formed. An $n^-$ type epitaxial layer 4 is grown over the semiconductor substrate. Next, p well layers 6 are formed by means of a resist mask (not shown) in a region wherein an NMOS transistor is to be formed and in a portion wherein collector and isolating regions of the PNP transistor are to be formed, that is, on the buried layers 3 by ion implantation. An n well layer 5 is formed by ion implantation in a region wherein a PMOS transistor is to be formed, that is, on one of the buried layers 2. The n well layer 5 may be formed in a portion wherein a collector region of an NPN transistor is to be formed, that is, on the other buried layer 2.

An LOCOS process is carried out by means of a nitride film mask (not shown) to form isolating oxide films 100. Before the LOCOS process, impurities for a channel-cutting $p^+$ diffusion layer to isolate transistors from each other, for example boron, are implanted to form channel cut layers 7. The isolating oxide films 100 are formed to cover the channel cut layers 7.

Figure 2:
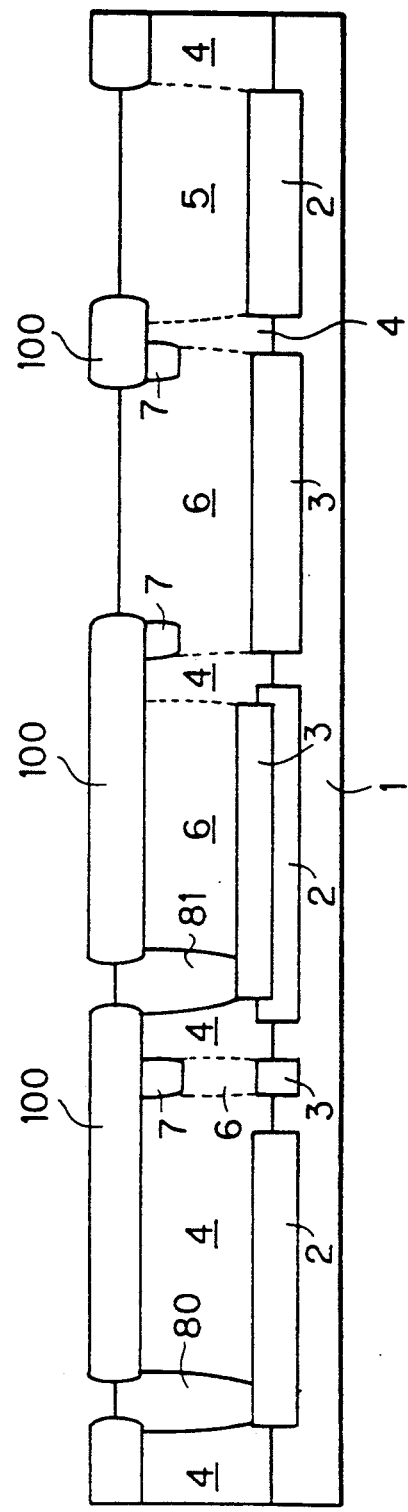
FIGS. 2 to 9 are cross-sectional views showing a method of fabricating the semiconductor device of the first preferred embodiment in sequence of fabrication.

An n type collector wall layer 80 and a p type collector wall layer 81 are formed by selective ion implantations with n type and p type impurities of high concentration and heat treatment, as shown in FIG. 2.

The MOS transistors are formed in a manner similar to the prior art. An oxide film and a polycrystalline silicon film for gate electrodes are formed on the semiconductor surface. Thereafter, n type impurities of high concentration are introduced into the polycrystalline silicon film, and patterning is performed by means of a resist mask (not shown) to form gate oxide films 110 and gate electrodes 200. To form $n^-$ layers 9 for the LDD of the NMOS transistor, ions of n type impurities of low concentration are selectively implanted into the p well layer 6. During the ion implantation process, the region wherein the PMOS transistor is to be formed or the n well layer 5 is covered with a resist mask (not shown). After the removal of the resist mask, an oxide film is formed all over. When dry etching is performed all over, the oxide film is left only in gate side wall portions, so that side walls 120 are formed.

Figure 3:
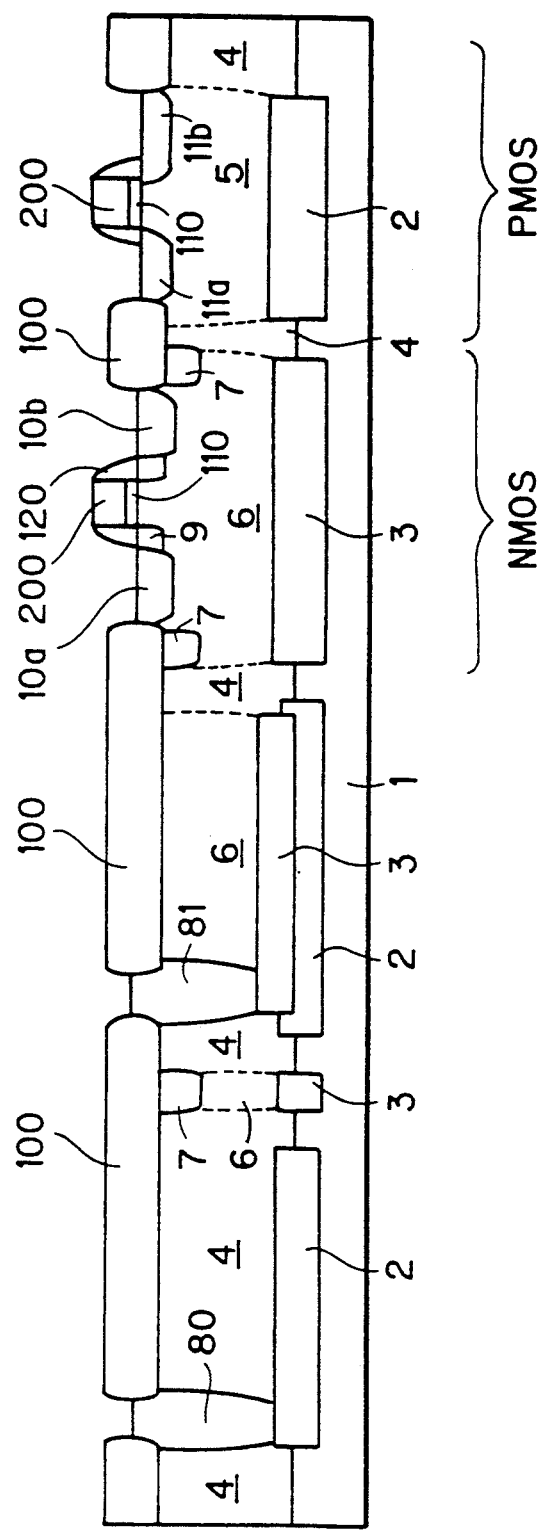

Subsequently, n type impurities of high concentration and p type impurities of high concentration are selectively implanted in series by means of a resist mask (not shown), and heat treatment is carried out. This provides the n− layers 9 for the LDD of the NMOS transistor, a source layer 10a thereof, a drain layer 10b thereof, a source layer 11a of the PMOS transistor, and a drain layer 11b thereof, as shown in FIG. 3.

Figure 4:
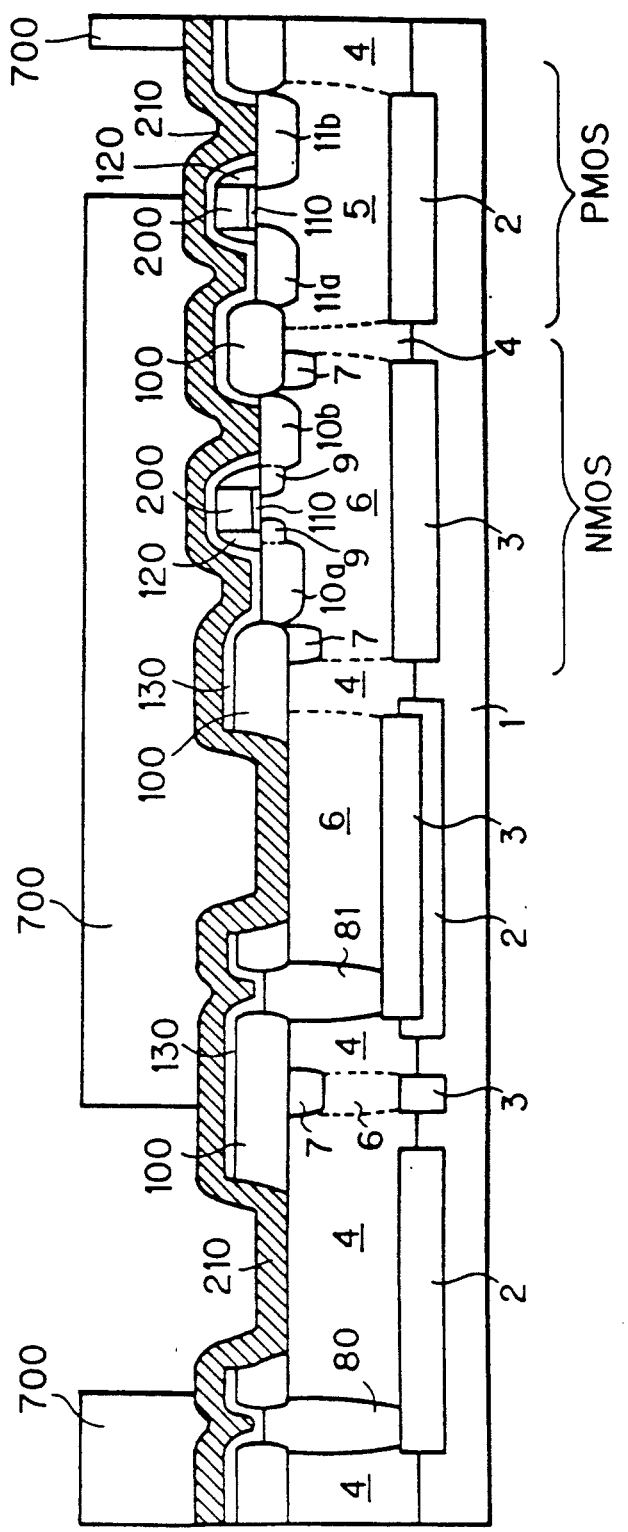

Next, the bipolar transistors will be fabricated in the process steps described below. An oxide film 130 is once deposited all over. The oxide films 100 and 130 are selectively etched away to expose the surfaces of the epitaxial layer 4 and p well layer 6. The surfaces of the drain layers 10a and 11a of the respective NMOS and PMOS transistors are exposed by selectively etching the oxide film 130. A polycrystalline silicon film 210 is deposited all over. A resist mask 700 is selectively formed to expose the polycrystalline silicon film 210 in a region wherein a base electrode of the NPN transistor is to be formed (above the epitaxial layer 4) and in a region wherein a drain electrode of the PMOS transistor is to be formed (above the drain layer 10b). as shown in FIG. 4. Ion implantation is performed such that p type impurities of high concentration stop within the polycrystalline silicon film 210.

Figure 5:
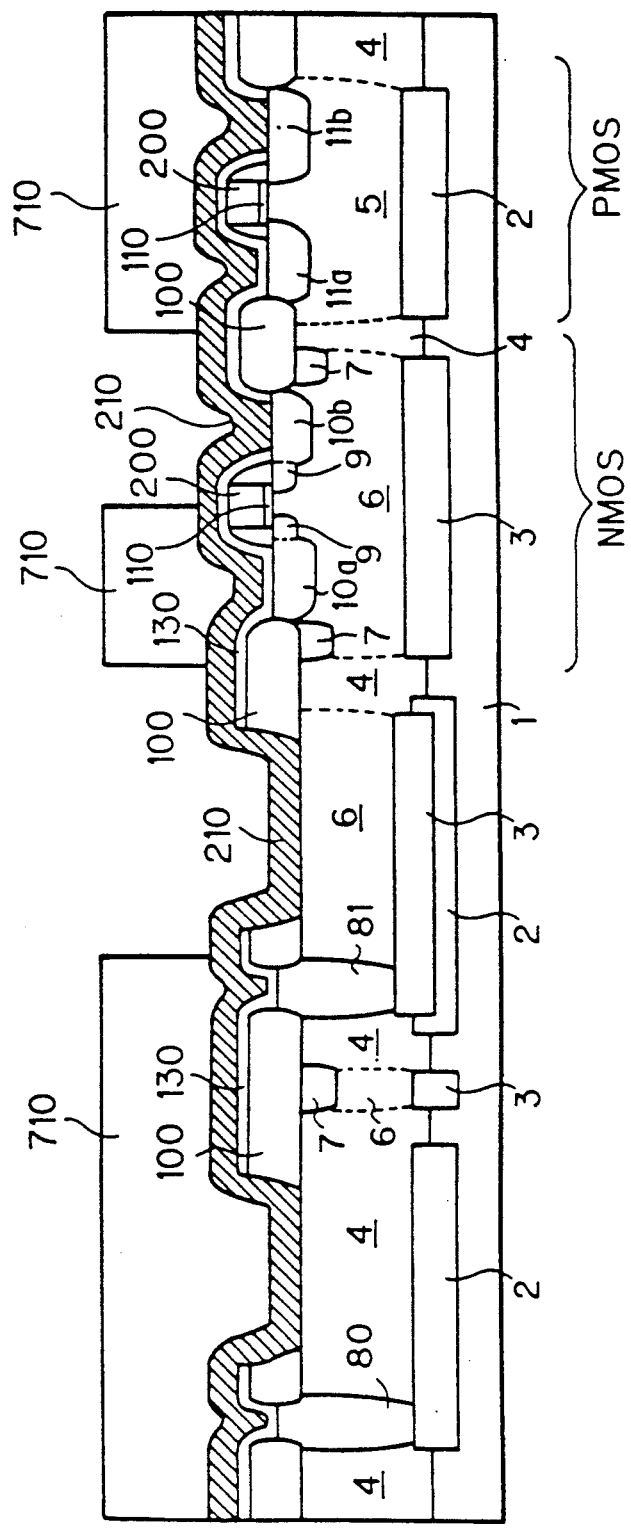

The resist mask 700 is removed, and a resist mask 710 is selectively formed such that the polyorystalline silicon film 210 is exposed in a region wherein a base electrode of the PNP transistor is to be formed (above the p well layer 6) and in a region wherein a drain electrode of the NMOS transistor is to be formed (above the drain layer 11b), as shown in FIG. 5. Ion implantation is performed such that n type impurities of high concentration stop within the polycrystalline silicon film 20.

After the removal of the resist mask 710, an oxide film is formed on the polycrystalline silicon film 210. The oxide film must be formed at low temperatures of below 500° C. so that the p type and n type impurities are not diffused into the epitaxial layer 4, n well layer 5, and p well layers 6 from the polycrystalline silicon film 210. The oxide film and polycrystalline silicon film 210 are selectively etched away by means of a resist mask (not shown) and are patterned to leave only parts of the oxide film and polycrystalline silicon film 210 which lie adjacent to the upper portions of the epitaxial layer 4, n well layer 5 and p well layers 6. The oxide film and polycrystalline silicon film 210 are further selectively removed to partially expose the surface of the epitaxial layer 4 end the surface of the p well layer 6 wherein the PNP transistor is to be formed. This provides base electrodes 300, 310 of the NPN and PNP transistors, drain electrodes 350, 360 of the NMOS and PMOS transistors, and insulating layers 140.

Figure 6:
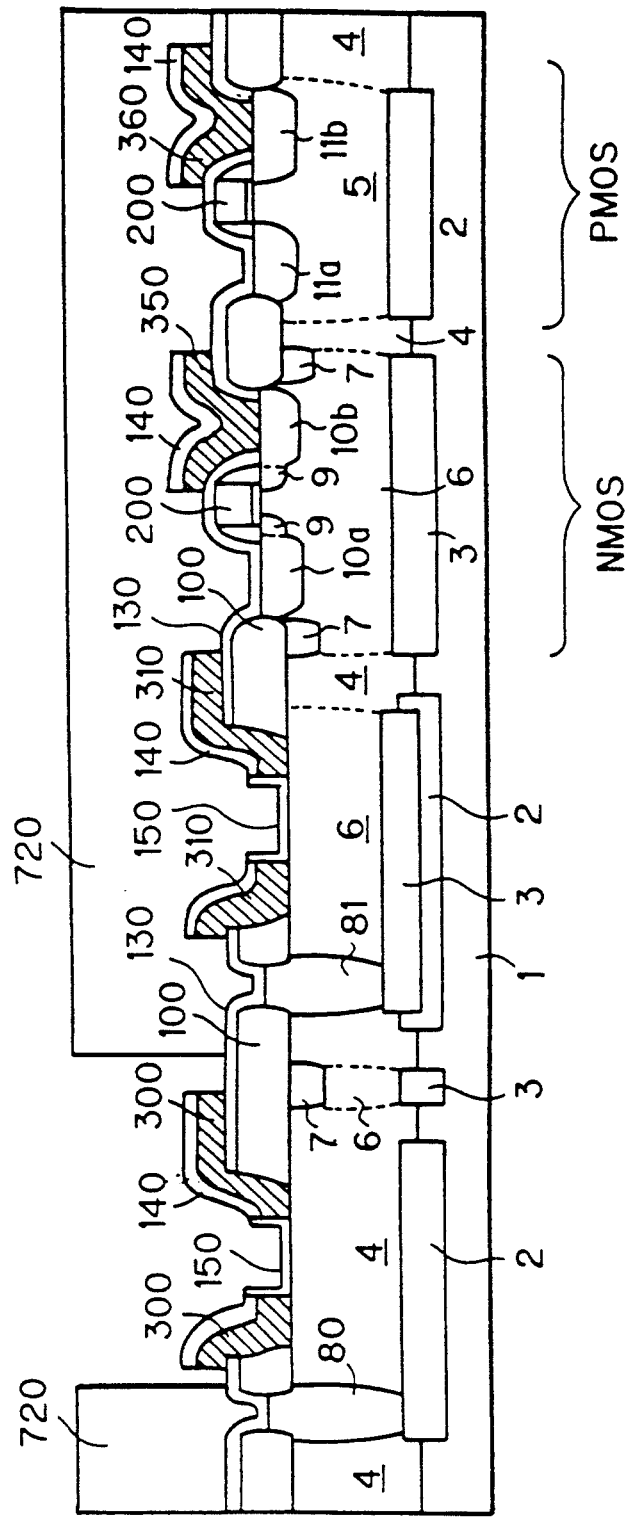

The exposed surfaces of the epitaxial layer 4 and p well layer 6 are thinly oxidized to form oxide films 150. A resist mask 720 is selectively formed, as shown in FIG. 6, and ions of p type impurities for an intrinsic base are selectively implanted into the epitaxial layer 4 through the oxide film 150.

Figure 7:
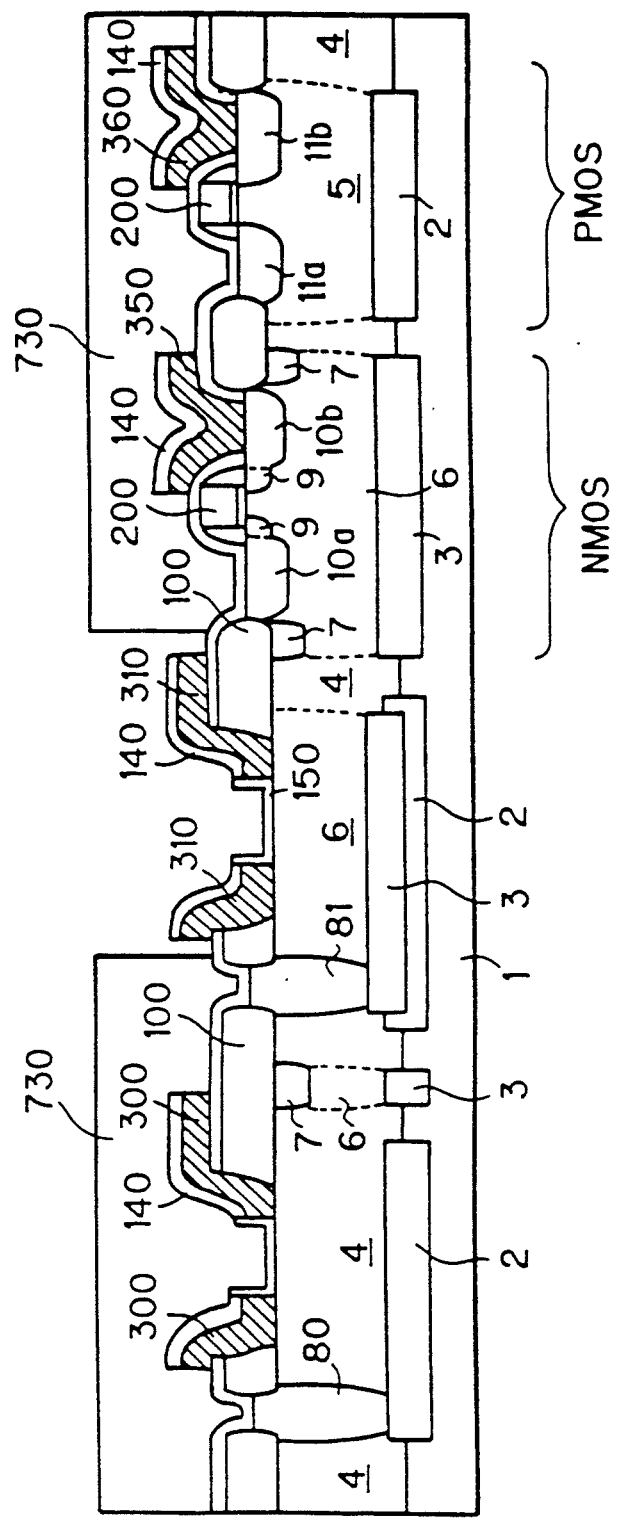

The resist mask 720 is removed, and a resist mask 730 is selectively formed, as shown in FIG. 7. Ions of n type impurities for an intrinsic base are selectively implanted into the p well layer 6 through the oxide film 150.

Heat treatment is performed to form external base layers 50 of the NPN transistor, an intrinsic base layer 51 thereof, external base layers 60 of the PNP transistor, and an intrinsic base layer 61 thereof. An oxide film is formed all over, and dry etching is carried out over the oxide film to selectively expose the intrinsic base layers 51 and 61. Emitter base electrode isolating oxide films 160 are formed at this time.

Figure 8:
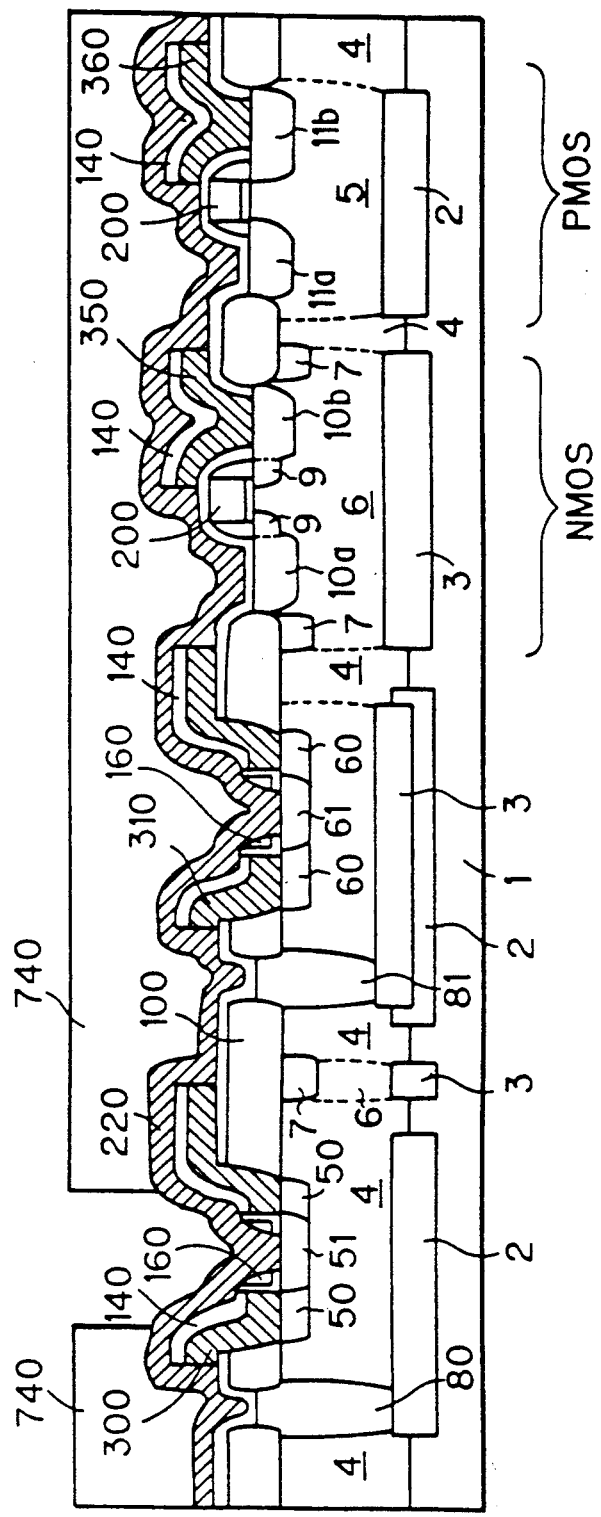

A polycrystalline silicon film 220 is deposited all over, and a resist mask 740 is selectively formed, as shown in FIG. 8. Then, n type impurities of high concentration are introduced into the polycrystalline silicon film 220 adjacent to the upper portion of the intrinsic base layer 51.

Figure 9:
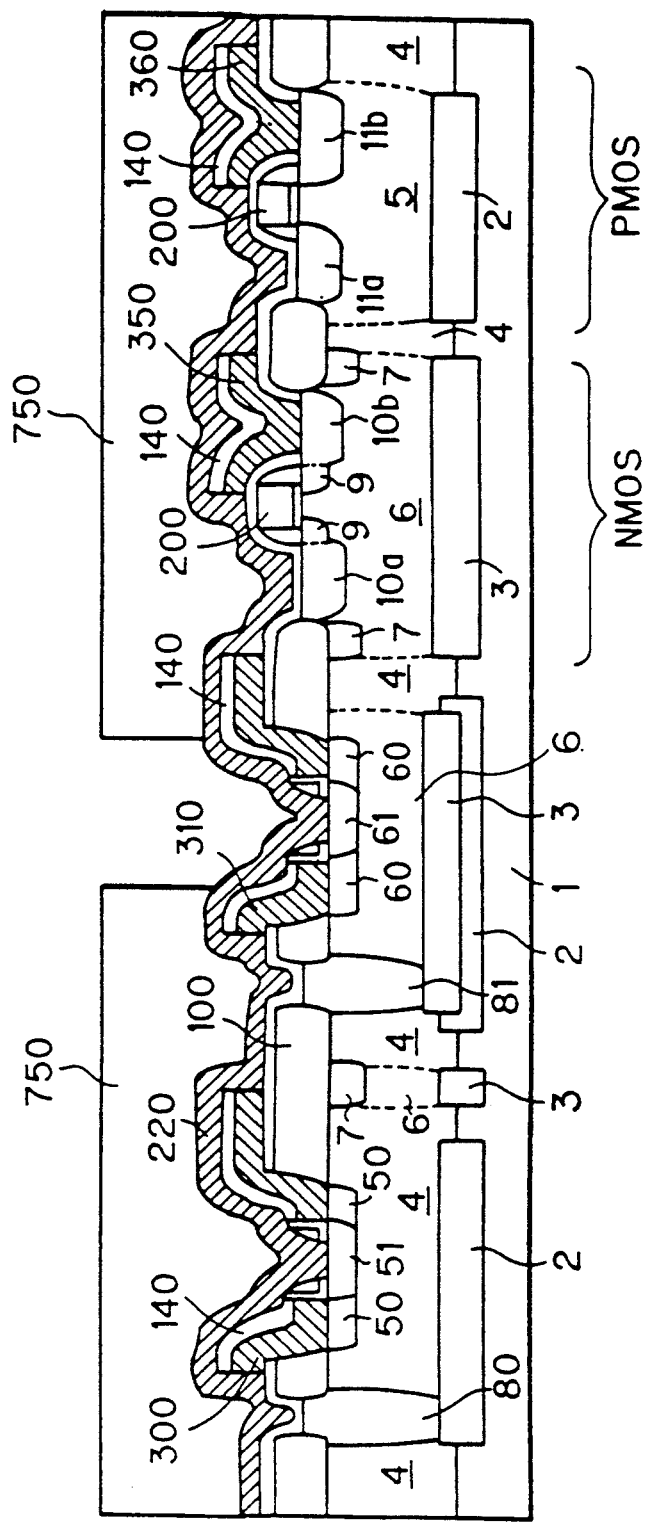

After the removal of the resist mask 740, a resist mask 750 is selectively formed, as shown in FIG. 9. Then, p type impurities of high concentration are introduced into the polycrystalline silicon film 220 adjacent to the upper portion of the intrinsic base layer 61.

The polycrystalline silicon film 220 is patterned by means of a resist mask (not shown) to simultaneously form an emitter electrode 320 of the NPN transistor and an emitter electrode 330 of the PNP transistor. Impurities are diffused from the emitter electrodes 320 and 330 by heat treatment to form an emitter layer 52 of the NPN transistor and an emitter layer 62 of the PNP transistor, respectively. After layer insulating films 400 are deposited, etching is performed to open via holes. By aluminium wiring are formed a collector extracting electrode 500 of the NPN transistor, an emitter extracting electrode 501 thereof, a base extracting electrode 502 thereof, a collector extracting electrode 510 of the PNP transistor, an emitter extracting electrode 511 thereof, a base extracting electrode 512 thereof, a source electrode 520 of the NMOS transistor, a drain extracting electrode 521 thereof, a source electrode 530 of the PMOS transistor, and a drain extracting electrode 531 thereof, as shown in FIG. 1.

The semiconductor device of the first preferred embodiment according to the present invention, in which the drain electrodes 360 and 350 of the PMOS and NMOS transistors are formed of the polyorystalline silicon film 210, affords the size reduction of the devices or transistors. The source electrodes 520 and 530 are formed of the aluminium wiring. Unlike the case in which the drain electrodes are formed of the aluminium wiring and the source electrodes are formed of the polycrystalline silicon layer, electric conductivity is not remarkably deteriorated in the preferred embodiment because carriers are preferably supplied from the source electrodes. In addition, since the base electrodes 300 and 310 of the NPN and PNP transistors are also formed of the polycrystalline silicon film 210, the process steps are simplified.

Figure 10:
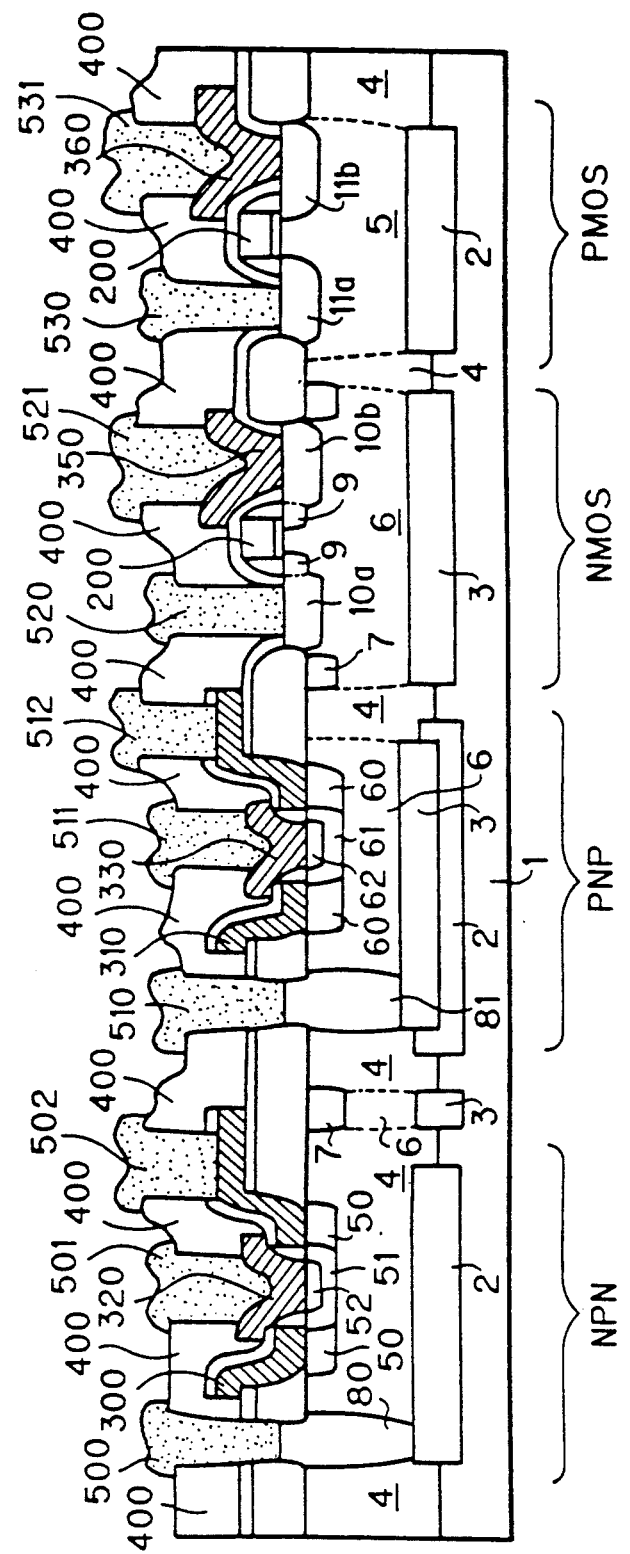
FIG. 10 is a cross-sectional view of the C-BiCMOS semiconductor device according to a second preferred embodiment of the present invention.

FIG. 10 is a cross-sectional view of the C-BiCMOS semiconductor device according to a second preferred embodiment of the present invention. FIGS. 11 to 16 are cross-sectional views showing a method of fabricating :he semiconductor device of the second preferred embodiment in sequence of fabrication. The method of the second preferred embodiment will be sequentially described with reference to FIGS. 11 to 16.

The PMOS and NMOS transistors are fabricated in a manner similar to the first preferred embodiment. The oxide film 130 is deposited all over. The oxide films 100 and 130 are selectively removed to expose the surfaces of the epitaxial layer 4 and p well layer 6. The second preferred embodiment shown in FIG. 1 is different from the first preferred embodiment shown in FIG. 4 in that parts of the oxide film 130 which are on the drain layers 10b and 11b of the NMOS and PMOS transistors are not etched away so that the n well layer 5 and p well layer 6 are not exposed.

Figure 11:
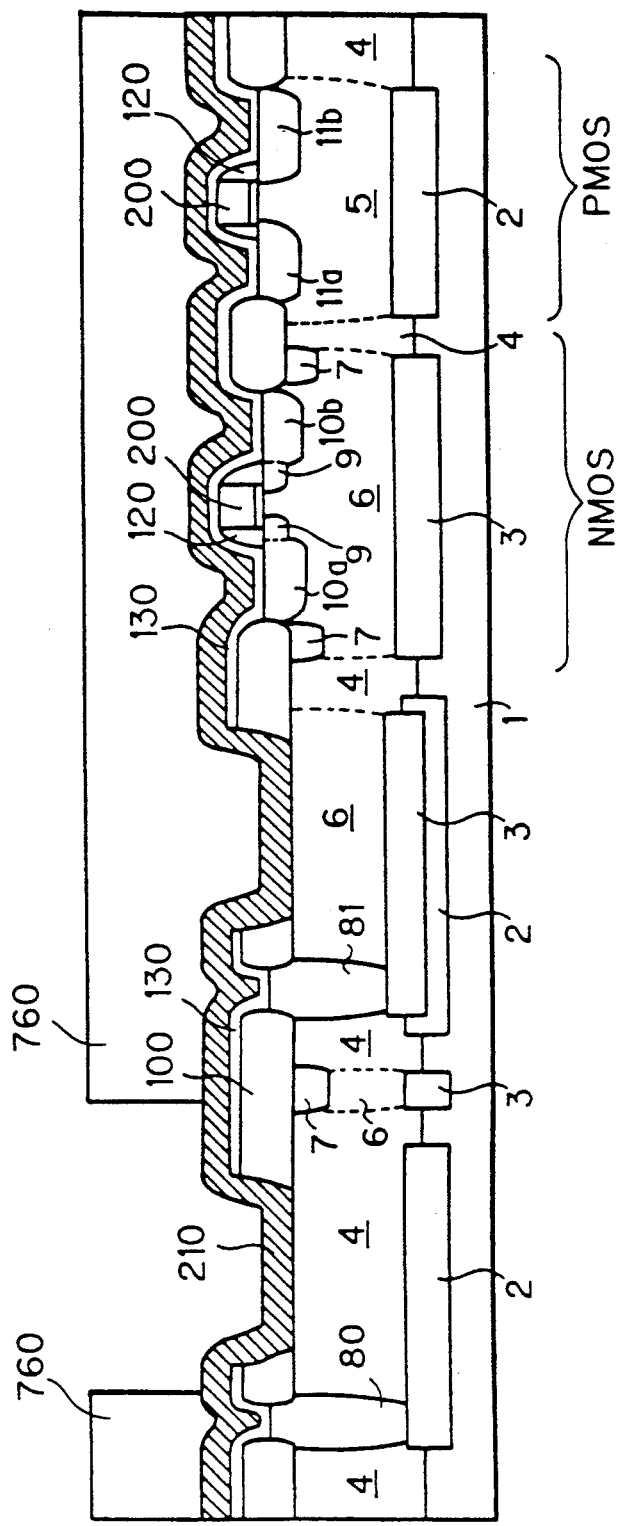
FIGS. 11 to 16 are cross-sectional views showing a method of fabricating the semiconductor device of the second preferred embodiment in sequence of fabrication.

The polycrystalline silicon film 210 is deposited all over. A resist mask 760 is selectively formed to open the polycrystalline silicon film 210 only in the region wherein the base electrode of the NPN transistor is to be formed, as shown in FIG. 11. Ion implantation is performed such that p type impurities of high concentration stop within the polyorystalline silicon film 210.

Figure 12:
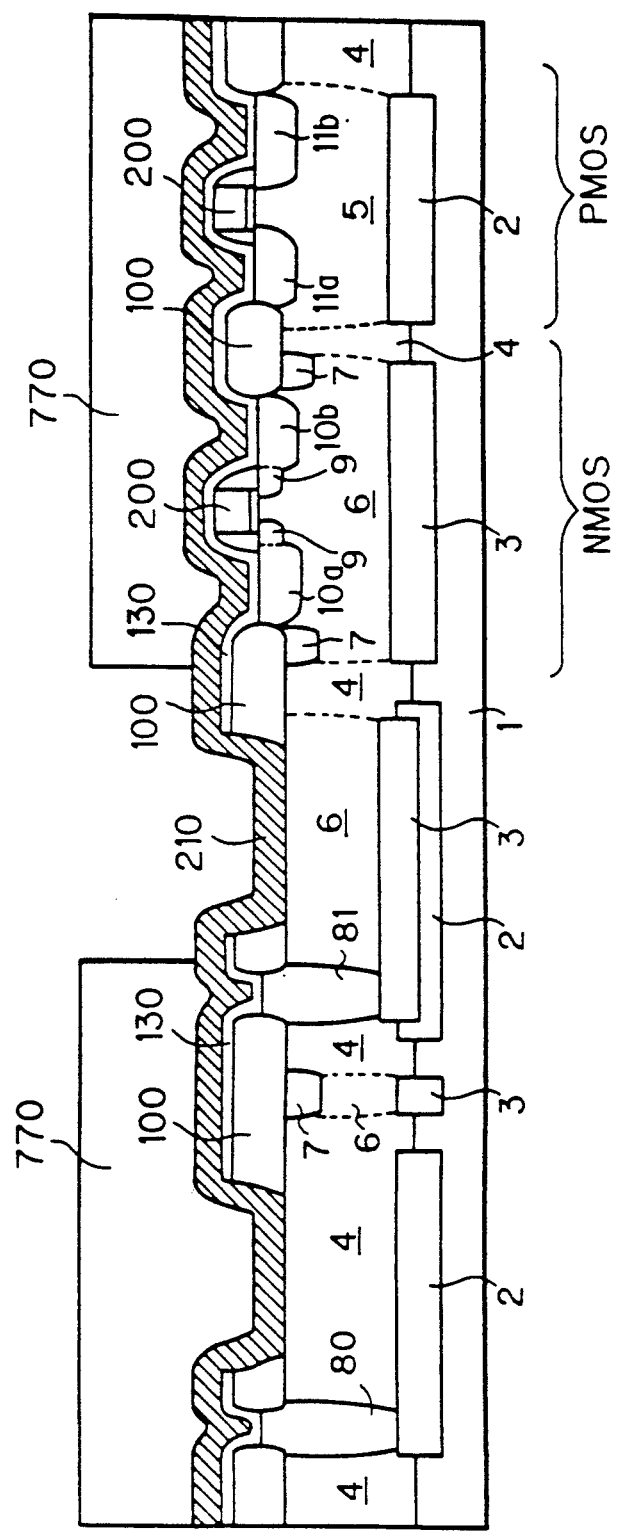

After the removal of the resist mask 760, a resist mask 770 is selectively formed to open the polyorystalline silicon film 210 only in the region wherein the base electrode of the PNP transistor is to be formed (above the p well layer 6). as shown in FIG. 12. Ion implantation is performed such that n type impurities of high concentration stop within the polycrystalline silicon film 210.

Figure 13:
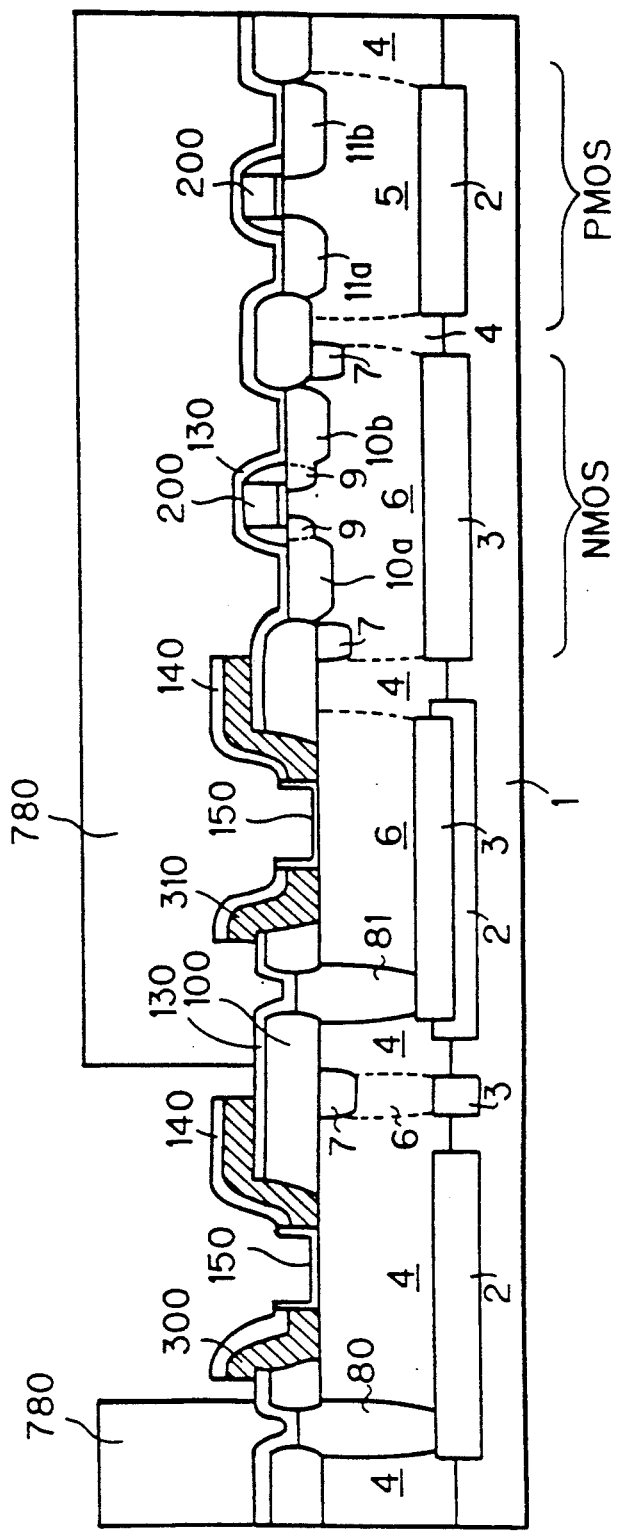
Figure 14:
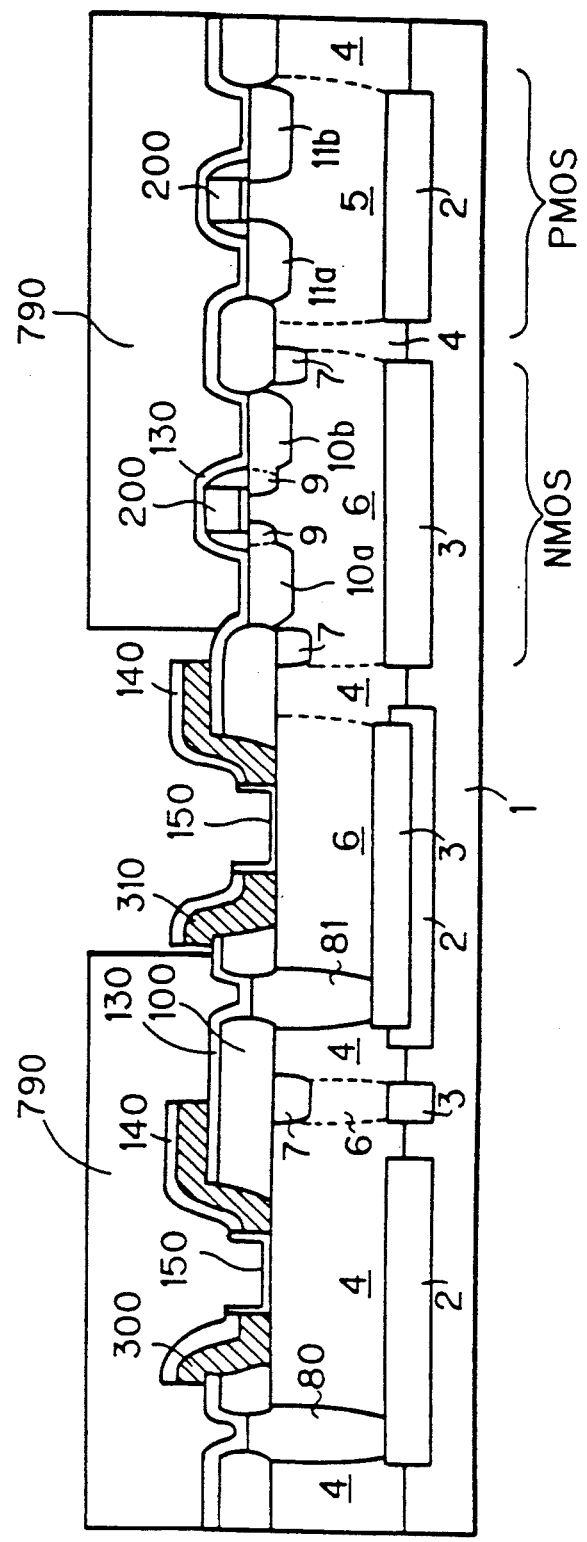

The resist mask 770 is removed, and then an oxide film is formed on the polycrystalline silicon film 210 at a low temperature. The oxide film and polycrystalline silicon film 210 are etched away by means of a resist mask (not shown) to form the base electrodes 300 and 310 and insulating films 140. Similarly to the method of the first preferred embodiment, ions of p type impurities for the intrinsic base are selectively implanted into the epitaxial layer 4 through the oxide film 50 by means of a resist mask 780 formed selectively, as shown in FIG. 13. After the removal of the resist mask 780, a resist mask 790 is selectively formed, as shown in FIG. 14, and ions of n type impurities for the intrinsic base are selectively implanted into the p well layer 6 through the oxide film 150.

Heat treatment is carried out to form the external base layers 50 of the NPN transistor, the intrinsic base layer 51 thereof, the external base layers 60 of the PNP transistor, and the intrinsic base layer 61 thereof. An oxide film is formed all over. The intrinsic base layers 51 and 61 are exposed by dry etching of the oxide film, and the emitter base electrode isolating oxide films 160 are formed. The oxide film 130 is selectively etched by means of a resist mask (not shown) to expose the surfaces of the drain layers 10b and 11b.

Figure 15:
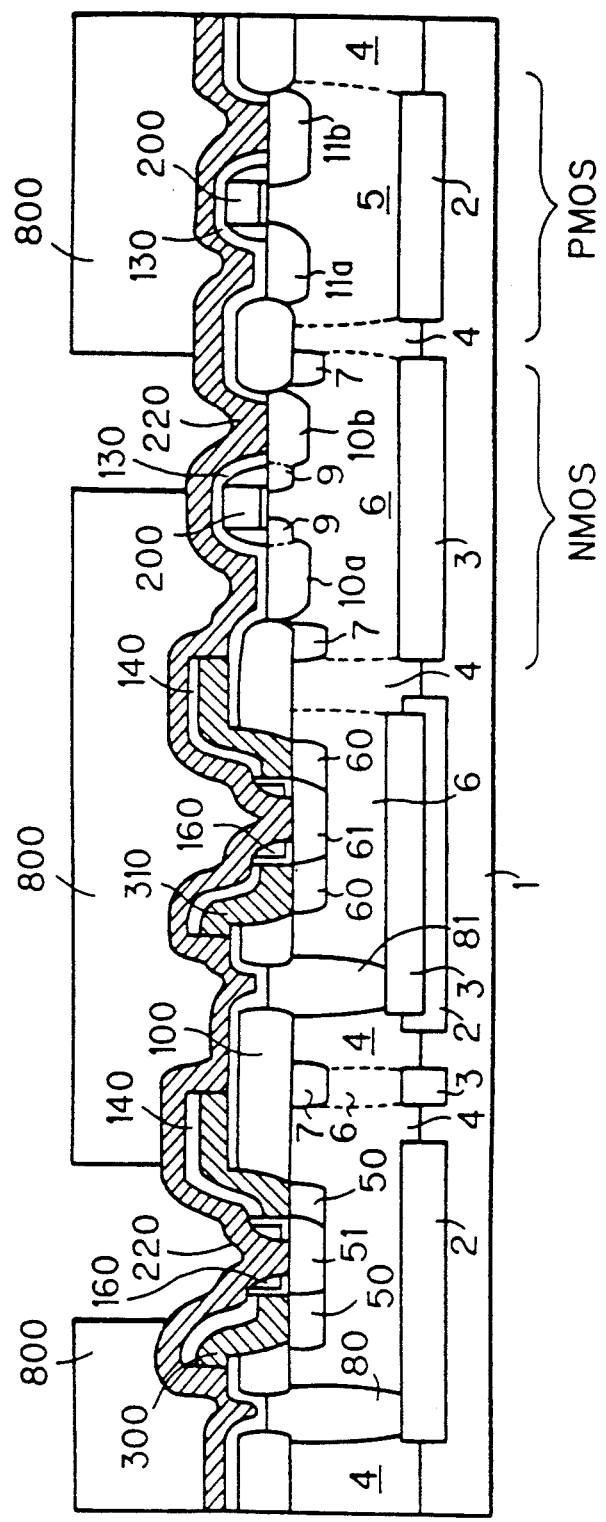

The polyorystalline silicon film 220 is deposited over the top surface. A resist mask 800 is selectively formed such that the polycrystalline silicon film 220 is exposed only in regions adjacent to the upper portions of the intrinsic base layer 51 of the NPN transistor and the drain layer 10b of the NMOS transistor, as shown in FIG. 15. Ions of n type impurities of high concentration are implanted into the polycrystalline silicon film 220.

Figure 16:
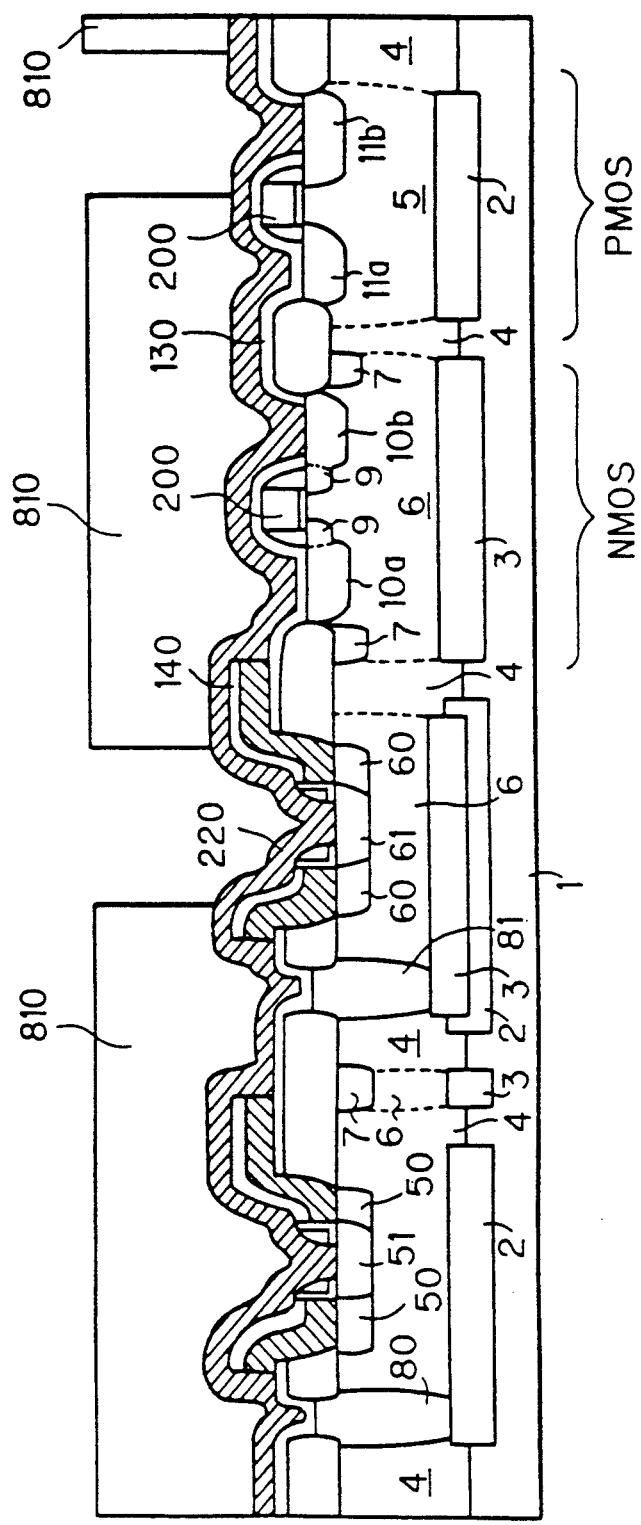
Figure 17:
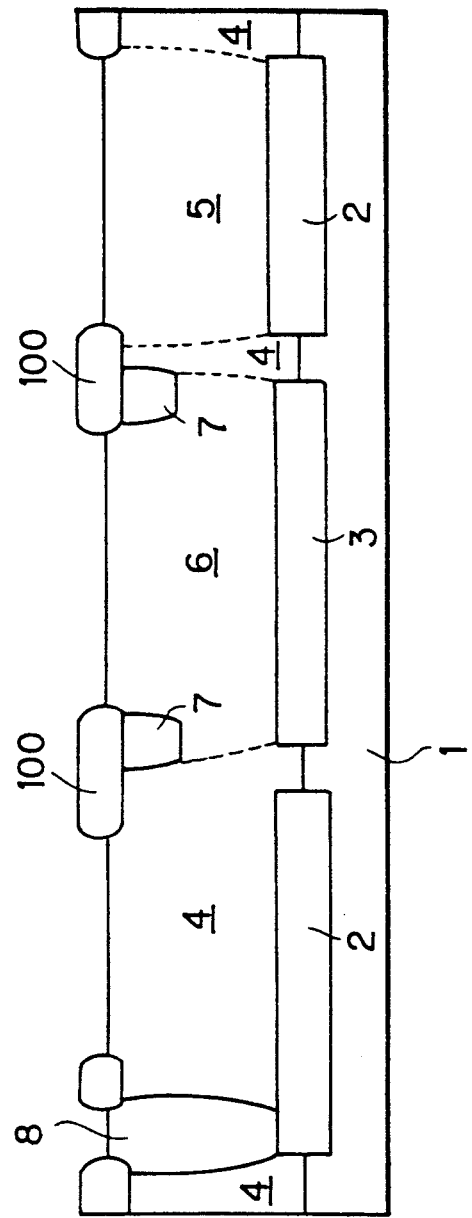
FIGS. 17 to 21 are cross sectional views showing the prior art in sequence of fabrication.
Figure 18:
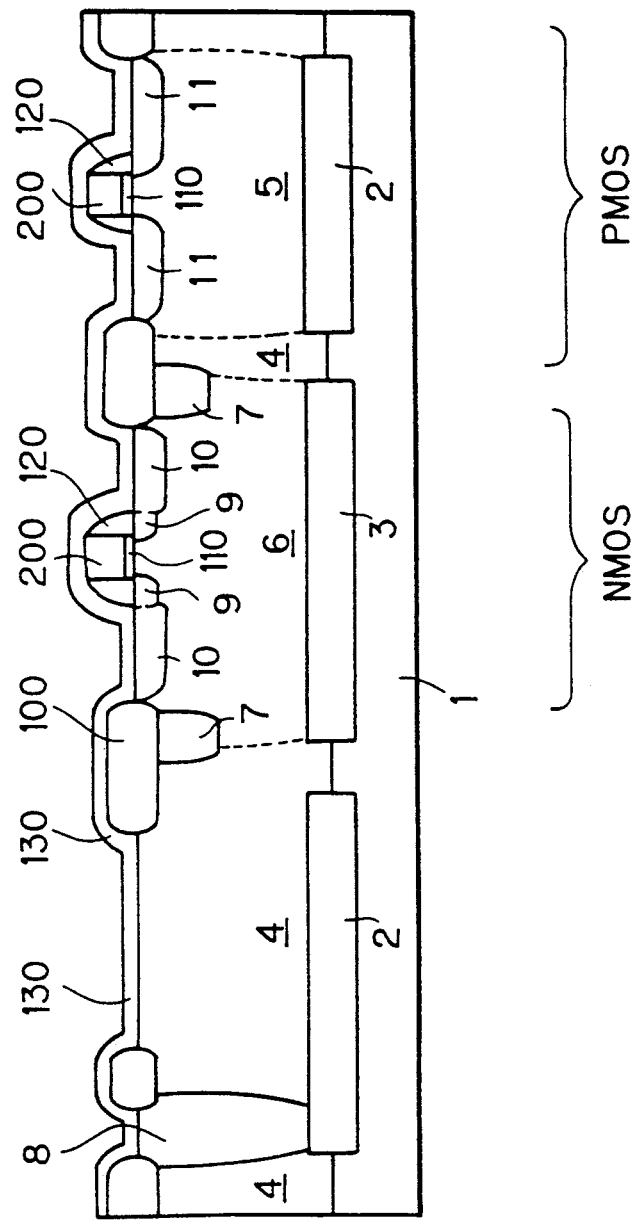
Figure 19:
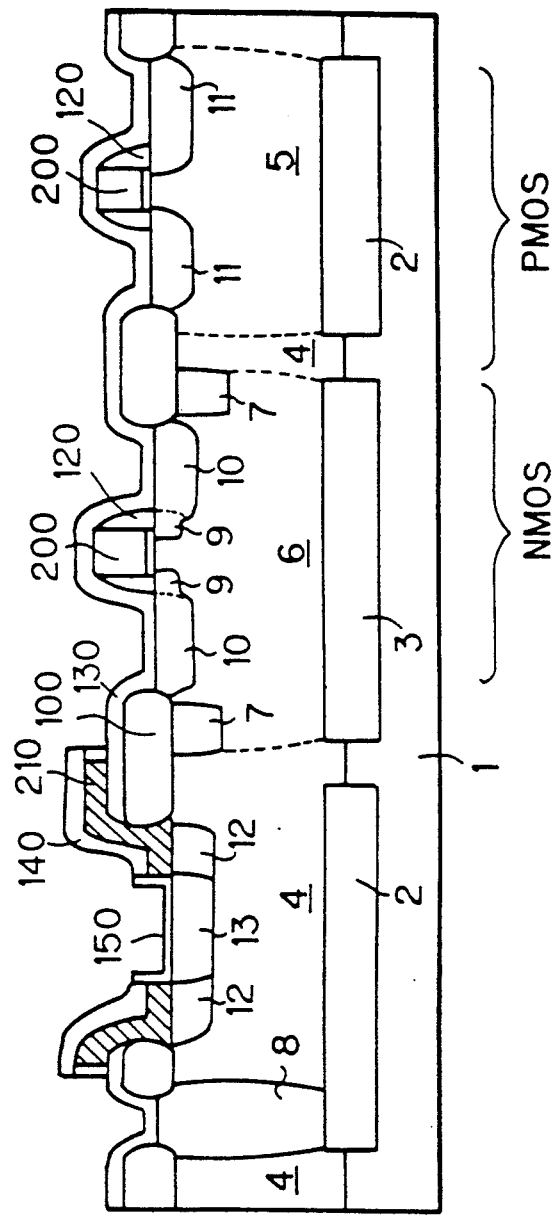
Figure 20:
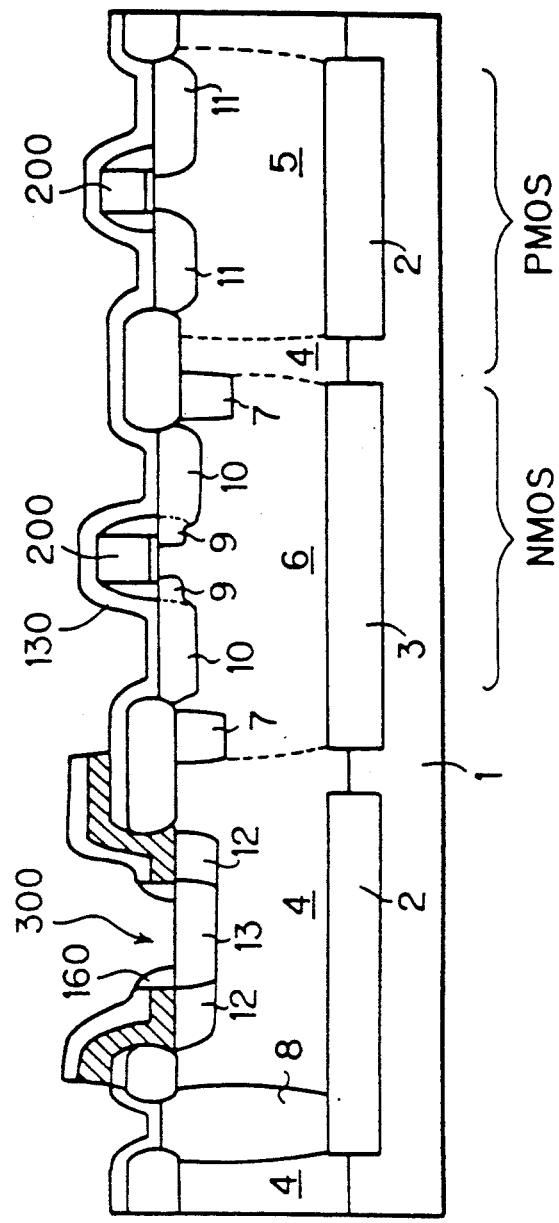
Figure 21:
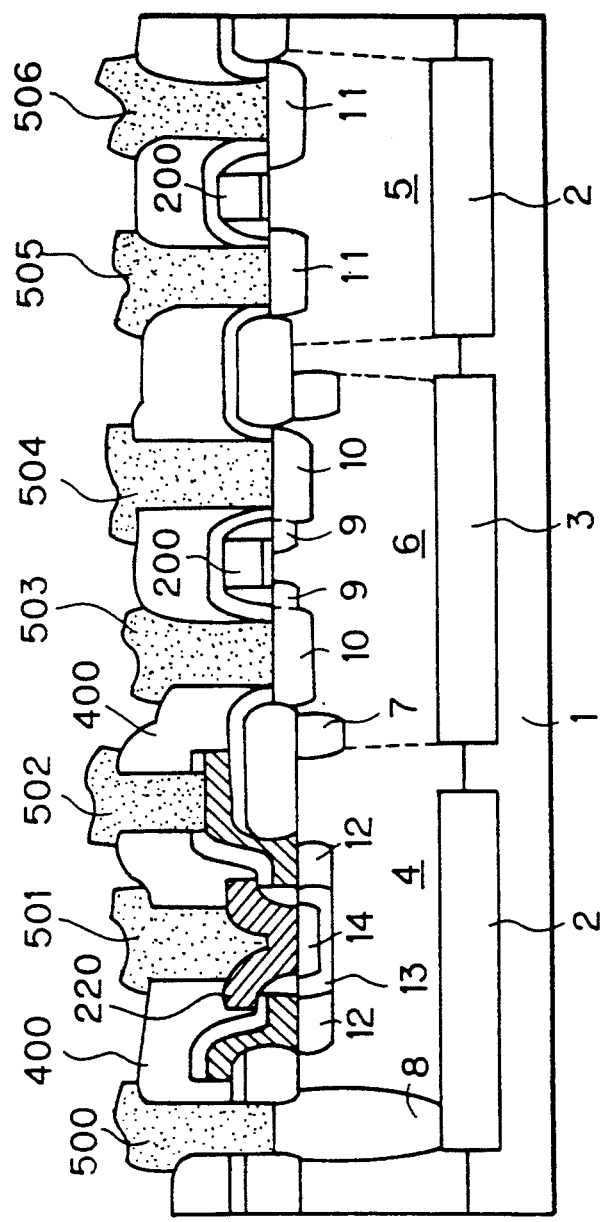

A resist mask 810 is selectively formed such that the polyorystalline silicon film 220 is exposed only in regions adjacent to the upper portions of the intrinsic base layer 61 of the PNP transistor and the drain layer 11b of the PMOS transistor, as shown in FIG. 16. Ions of p type impurities of high concentration are implanted into the polycrystalline silicon film 220.

The resist mask 810 is removed. The emitter electrodes 320 and 330 of the NPN and PNP transistors and the drain electrodes 350 and 360 of the NMOS and PMOS transistors are formed simultaneously by patterning, using a resist mask (not shown).

Final heat treatment is performed to diffuse impurities from the emitter electrodes 320 and 330. The emitter layers 52 and 62 of the NPN and PNP transistors are formed, as shown in FIG. 10.

The succeeding step of forming the aluminium wiring of the second preferred embodiment is the same as that of the first preferred embodiment, and the description thereof will be omitted.

The semiconductor device of the second preferred embodiment, in which the drain electrodes 360 and 350 of the PMOS and NMOS transistors are formed of the polycrystalline silicon film 220, affords the size reduction of the devices or transistors. The source electrodes 520 and 530 are formed of the aluminium wiring. Unlike the case in which the drain electrodes are formed of the aluminium wiring and the source electrodes are formed of the polycrystalline silicon layer, the carriers are preferably supplied from the source electrodes in the second preferred embodiment. The electric conductivity is not remarkably deteriorated. In addition, since the emitter electrodes 320 and 330 of the NPN and PNP transistors are also formed of the polycrystalline silicon film 220, the process steps are simplified.

While the invention has been shown and described in detail, the foregoing description is in all aspects illustrative and not restrictive. It is therefore understood that numerous modifications and variations can be devised without departing from the scope of the invention.

We claim:

1. A C-BiCMOS semiconductor device comprising:
   (a) a first semiconductor layer of a first conductivity type, a second semiconductor layer of a second conductivity type, a third semiconductor layer of the second conductivity type, and a fourth semiconductor layer of the first conductivity type, said first to fourth semiconductor layers being formed in an upper surface of the same substrate;
   (b) a first MOS transistor including a pair of fifth semiconductor layers of the first conductivity type selectively formed in an upper surface of said third semiconductor layer and serving as a pair of current electrodes, a first electrode extracting layer consisting essentially of a polycrystalline semiconductor having a first impurity of the first conductivity type and contacting one of said fifth semiconductor layers, and a first metal conductor contacting the other fifth semiconductor layer;
   (c) a second MOS transistor including a pair of sixth semiconductor layers of the second conductivity type selectively formed in an upper surface of said fourth semiconductor layer and serving as a pair of current electrodes, a second electrode extracting layer consisting essentially of a polycrystalline semiconductor having a second impurity of the second conductivity type and contacting one of said sixth semiconductor layers, and a second metal conductor contacting the other sixth semiconductor layer;
   (d) a first bipolar transistor including a seventh semiconductor layer of the first conductivity type selectively formed in an upper surface of said second semiconductor layer, an eighth semiconductor layer of the second conductivity type selectively formed in an upper surface of said seventh semiconductor layer, and a third electrode extracting layer consisting essentially of said polycrystalline semiconductor having said first impurity and contacting said seventh semiconductor layer; and (e) a second bipolar transistor including a ninth semiconductor layer of the second conductivity type selectively formed in an upper surface of said first semiconductor layer, a tenth semiconductor layer of the first conductivity type selectively formed in an upper surface of said ninth semiconductor layer, and a fourth electrode extracting layer consisting essentially of said polycrystalline semiconductor having said second impurity and contacting said ninth semiconductor layer.

2. The C-BiCMOS semiconductor device of claim 1, wherein said one fifth semiconductor layer is a drain.

3. The C-BiCMOS semiconductor device of claim 2, wherein said one sixth semiconductor layer is a drain.

4. The C-BiCMOS semiconductor device of claim 3, wherein said first and second conductors have aluminium.

5. The C-BiCMOS semiconductor device of claim 4, wherein said substrate includes an eleventh semiconductor layer of the second conductivity type.

6. The C-BiCMOS semiconductor device of claim 5, wherein said substrate further includes a twelfth semiconductor layer of the first conductivity type formed on an upper surface of said eleventh semiconductor layer, and
wherein said second to fourth semiconductor layers are selectively formed in said twelfth semiconductor layer.

7. The C-BiCMOS semiconductor device of claim 6, wherein said first semiconductor layer serves as said twelfth semiconductor layer.

8. The C-BiCMOS semiconductor device of claim 6, wherein said first semiconductor layer is selectively formed in said twelfth semiconductor layer.

9. The C-BiCMOS semiconductor device of claim 7, further comprising:
first to third buried layers of the first conductivity type selectively formed isolatedly from each other across the upper surface of said eleventh semiconductor layer;
a fourth buried layer of the second conductivity type selectively formed across the upper surface of said eleventh semiconductor layer between said second and third buried layers; and
a fifth buried layer of the second conductivity type selectively formed across an upper surface of said second buried layer,
said twelfth semiconductor layer being formed on the upper surfaces of said second to fifth buried layers and said eleventh semiconductor layer,
said second semiconductor layer being formed on said fifth buried layer, said third semiconductor layer being formed on said fourth buried layer, said fourth semiconductor layer being formed on said third buried layer.

10. The C-BiCMOS semiconductor device of claim 9, further comprising isolating layers formed across the upper surfaces of said first and second semiconductor layers.

11. The C-BiCMOS semiconductor device of claim 10, wherein said first MOS transistor further includes:
a first insulating layer formed on the upper surface of part of said third semiconductor layer which is between said fifth semiconductor layers; and
a first control electrode formed above said third semiconductor layer through said first insulating layer.

12. The C-BiCMOS semiconductor device of claim 11, wherein said fifth semiconductor layers are structured such that an impurity concentration thereof is lowered in the vicinity of said first control electrode.

13. The C-BiCMOS semiconductor device of claim 12, wherein said isolating layers are also selectively formed across the upper surfaces of said third, fourth and twelfth semiconductor layers adjacent to each other.

14. The C-BiCMOS semiconductor device of claim 13,
wherein said second MOS transistor further includes:
a second insulating layer formed on the upper surface of part of said fourth semiconductor layer which is between said sixth semiconductor layers; and
a second control electrode formed above said fourth semiconductor layer through said second insulating layer.

15. The C-BiCMOS semiconductor device of claim 14,
wherein said polycrystalline semiconductor having said first impurity is formed by selectively introducing said first impurity into a firs& polycrystalline semiconductor layer formed in selective contact with said first to fourth semiconductor layers.

16. The C-BiCMOS semiconductor device of claim 15,
wherein said polycrystalline semiconductor having said second impurity is formed by selectively introducing said second impurity into said first polycrystalline semiconductor layer.

17. The C-BiCMOS semiconductor device of claim 16,
wherein said first bipolar transistor further includes a thirteenth semiconductor layer of the first conductivity type selectively formed in said seventh semiconductor layer and having a lower impurity concentration than said seventh semiconductor layer.

18. The C-BiCMOS semiconductor device of claim 17,
wherein said first bipolar transistor further includes a fifth electrode extracting layer connected to said eighth semiconductor layer and consisting essentially of a polycrystalline semiconductor having said second impurity.

19. The C-BiCMOS semiconductor device of claim 18,
wherein said fifth electrode extracting layer is formed by selectively introducing said third impurity into a second polycrystalline semiconductor layer formed in selective contact with said eighth and tenth semiconductor layers.

20. The C-BiCMOS semiconductor device of claim 19,
wherein said first bipolar transistor further includes a fourteenth semiconductor layer of the second conductivity type extending from the upper surface of said second semiconductor layer to said fifth buried layer.

21. The C-BiCMOS semiconductor device of claim 19,
wherein said second bipolar transistor further includes
a fifteenth semiconductor layer of the first conductivity type selectively formed in said ninth semiconductor layer and having a lower impurity concentration than said ninth semiconductor layer.

22. The C-BiCMOS semiconductor device of claim 21, wherein said second bipolar transistor further includes
a sixth electrode extracting layer connected to said tenth semiconductor layer and consisting essentially of a polycrystalline semiconductor having said first impurity.

23. The C-BiCMOS semiconductor device of claim 22, wherein said sixth electrode extracting layer is formed by selectively introducing said first impurity into said second polycrystalline semiconductor layer.

24. The C-BiCMOS semiconductor device of claim 23, wherein said second bipolar transistor further includes
a sixteenth semiconductor layer of the first conductivity type extending from the upper surface of said first semiconductor layer to said first buried layer.

25. The C-BiCMOS semiconductor device of claim 23, further comprising seventeenth semiconductor layers of the second conductivity type selectively formed under a lower surface of said isolating layers.

26. The C-BiCMOS semiconductor device of claim 25, wherein some of said seventeenth semiconductor layers are formed within said third semiconductor layer in the vicinity of said first semiconductor layer.

27. The C-BiCMOS semiconductor device of claim 26, further comprising:
a sixth buried layer of the second conductivity type formed across the upper surface of said eleventh semiconductor layer between said first and second buried layers; and
an eighteenth semiconductor layer of the second conductivity type formed on an upper surface of said sixth buried layer,
one of said seventeenth semiconductor layers being formed on an upper surface of said eighteenth semiconductor layer.

28. A C-BiCMOS semiconductor device comprising:
(a) a first semiconductor layer of a first conductivity type, a second semiconductor layer of a second conductivity type, a third semiconductor layer of the second conductivity type, and a fourth semiconductor layer of the first conductivity type, said first to fourth semiconductor layers being formed in an upper surface of the same substrate;
(b) a first MOS transistor including a pair of fifth semiconductor layers of the first conductivity type selectively formed in an upper surface of said third semiconductor layer and serving as a pair of current electrodes, a first electrode extracting layer consisting essentially of a polycrystalline semiconductor having a first impurity of the first conductivity type and contacting one of said fifth semiconductor layers, and a first metal conductor contacting the other fifth semiconductor layer;
(c) a second MOS transistor including a pair of sixth semiconductor layers of the second conductivity type selectively formed in an upper surface of said fourth semiconductor layer and serving as a pair of current electrodes, a second electrode extracting layer consisting essentially of a polycrystalline semiconductor having a second impurity of the second conductivity type and contacting one of said sixth semiconductor layers, and a second metal conductor contacting the other sixth semiconductor layer;
(d) a first bipolar transistor including a seventh semiconductor layer of the second conductivity type selectively formed in an upper surface of said first semiconductor layer, an eighth semiconductor layer of the first conductivity type selectively formed in an upper surface of said seventh semiconductor layer, and a third electrode extracting layer consisting essentially of said polycrystalline semiconductor having said first impurity and contacting said eighth semiconductor layer; and
(e) a second bipolar transistor including a ninth semiconductor layer of the first conductivity type selectively formed in an upper surface of said second semiconductor layer, a tenth semiconductor layer of the second conductivity type selectively formed in an upper surface of said ninth semiconductor layer, and a fourth electrode extracting layer consisting essentially of said polycrystalline semiconductor having said second impurity and contacting said tenth semiconductor layer.

29. The C-BiCMOS semiconductor device of claim 28, wherein said one fifth semiconductor layer is a drain.

30. The C-BiCMOS semiconductor device of claim 29, wherein said one sixth semiconductor layer is a drain.

31. The C-BiCMOS semiconductor device of claim 30, wherein said first and second conductors have aluminium.

32. The C-BiCMOS semiconductor device of claim 31, wherein said substrate includes an eleventh semiconductor layer of the second conductivity type.

33. The C-BiCMOS semiconductor device of claim 32,
wherein said substrate further includes a twelfth semiconductor layer of the first conductivity type formed on an upper surface of said eleventh semiconductor layer, and
wherein said second to fourth semiconductor layers are selectively formed in said twelfth semiconductor layer.

34. The C-BiCMOS semiconductor device of claim 33, wherein said first semiconductor layer serves as said twelfth semiconductor layer.

35. The C-BiCMOS semiconductor device of claim 33, wherein said first semiconductor layer is selectively formed in said twelfth semiconductor layer.

36. The C-BiCMOS semiconductor device of claim 34, further comprising:
first to third buried layers of the first conductivity type selectively formed isolatedly from each other across the upper surface of said eleventh semiconductor layer;
a fourth buried layer of the second conductivity type selectively formed across the upper surface of said eleventh semiconductor layer between said second and third buried layers; and
a fifth buried layer of the second conductivity type selectively formed across an upper surface of said second buried layer,
said twelfth semiconductor layer being formed on the upper surfaces of said second to fifth buried layers and said eleventh semiconductor layer, said second semiconductor layer being formed on said fifth buried layer, said third semiconductor layer being formed on said fourth buried layer, said fourth semiconductor layer being formed on said third buried layer.

37. The C-BiCMOS semiconductor device of claim 36, further comprising isolating layers formed across the upper surfaces of said first and second semiconductor layers.

38. The C-BiCMOS semiconductor device of claim 37,
wherein said first MOS transistor further includes:
a first insulating layer formed on the upper surface of part of said third semiconductor layer which is between said fifth semiconductor layers; and
a first control electrode formed above said third semiconductor layer through said first insulating layer.

39. The C-BiCMOS semiconductor device of claim 38, wherein said fifth semiconductor layers are structured such that an impurity concentration thereof is lowered in the vicinity of said first control electrode.

40. The C-BiCMOS semiconductor device of claim 39, wherein said isolating layers are also selectively formed across the upper surfaces of said third, fourth and twelfth semiconductor layers adjacent to each other.

41. The C-BiCMOS semiconductor device of claim 40,
wherein said second MOS transistor further includes:
a second insulating layer formed on the upper surface of part of said fourth semiconductor layer which is between said sixth semiconductor layers; and
a second control electrode formed above said fourth semiconductor layer through said second insulating layer.

42. The C-BiCMOS semiconductor device of claim 41,
wherein said polycrystalline semiconductor having said first impurity is formed by selectively introducing said first impurity into a first polyorystalline semiconductor layer formed in selective contact with said third, fourth, seventh and ninth semiconductor layers.

43. The C-BiCMOS semiconductor device of claim 42,
wherein said polycrystalline semiconductor having said second impurity is formed by selectively introducing said second impurity into said first polyorystalline semiconductor layer.

44. The C-BiCMOS semiconductor device of claim 43,
wherein said first bipolar transistor further includes
a thirteenth semiconductor layer of the first conductivity type selectively formed in said seventh semiconductor layer and having a lower impurity concentration than said seventh semiconductor layer.

45. The C-BiCMOS semiconductor device of claim 44,
wherein said first bipolar transistor further includes
a fifth electrode extracting layer connected to said seventh semiconductor layer and consisting essentially of a polycrystalline semiconductor having said second impurity.

46. The C-BiCMOS semiconductor device of claim 45,
wherein said fifth electrode extracting layer is formed by selectively introducing said second impurity into a second polycrystalline semiconductor layer formed in selective contact with said seventh and ninth semiconductor layers.

47. The C-BiCMOS semiconductor device of claim 46,
wherein said first bipolar transistor further includes
a fourteenth semiconductor layer of the first conductivity type extending from the upper surface of said first semiconductor layer to said first buried layer.

48. The C-BiCMOS semiconductor device of claim 46,
wherein said second bipolar transistor further includes
a fifteenth semiconductor layer of the first conductivity type selectively formed in said ninth semiconductor layer and having a lower impurity concentration than said ninth semiconductor layer.

49. The C-BiCMOS semiconductor device of claim 48,
wherein said second bipolar transistor further includes
a sixth electrode extracting layer connected to said ninth semiconductor layer and consisting essentially of a polycrystalline semiconductor having said first impurity.

50. The C-BiCMOS semiconductor device of claim 49,
wherein said sixth electrode extracting layer is formed by selectively introducing said first impurity into said second polyorystalline semiconductor layer.

51. The C-BiCMOS semiconductor device of claim 50,
wherein said second bipolar transistor further includes
a sixteenth semiconductor layer of the second conductivity type extending from the upper surface of said second semiconductor layer to said fifth buried layer.

52. The C-BiCMOS semiconductor device of claim 50, further comprising seventeenth semiconductor layers of the second conductivity type selectively formed under a lower surface of said isolating layers.

53. The C-BiCMOS semiconductor device of claim 52, wherein some of said seventeenth semiconductor layers are formed within said third semiconductor layer in the vicinity of said first semiconductor layer.

54. The C-BiCMOS semiconductor device of claim 53, further comprising:
a sixth buried layer of the second conductivity type formed across the upper surface of said eleventh semiconductor layer between said first and second buried layers; and
an eighteenth semiconductor layer of the second conductivity type formed on an upper surface of said sixth buried layer,
one of said seventeenth semiconductor layers being formed on an upper surface of said eighteenth semiconductor layer.

55. The C-BiCMOS semiconductor device of claim 1, wherein said first, second, third and fourth semiconductor layers are consecutively formed in said upper surface of said substrate.

56. The C-BiCMOS semiconductor device of claim 28, wherein said first, second, third and fourth semiconductor layers are consecutively formed in said upper surface of said substrate.

57. A C-BiCMOS semiconductor device comprising:

a first MOS transistor having first source and drain regions;

a second MOS transistor having second source and drain regions;

a first bipolar transistor having a first base electrode; and a second bipolar transistor having a second base electrode;

wherein drain electrodes connected with said first and second drains and base electrodes connected with said first and second base regions are formed from a single polycrystalline semiconductor layer, and source electrodes connected to said first and second sources are formed of metal.

* * * * *

UNITED STATES PATENT AND TRADEMARK OFFICE
CERTIFICATE OF CORRECTION

PATENT NO. : 5,319,234
DATED : June 7, 1994
INVENTOR(S) : Kimiharu UGA et al.

It is certified that error appears in the above-indentified patent and that said Letters Patent is hereby corrected as shown below:

In the drawings, FIGURES 17-21, please change "(PRIOR ART)" to --(BACKGROUND ART)--.

Column, 1, line 36, change "polyorystalline" to --polycrystalline--.

Column, 4, line 40, change "polyorystalline" to --polycrystalline--.

Column, 5, line 19, change "polyorystalline" to --polycrystalline--.

Column, 8, line 46, change "polyorystalline" to --polycrystalline--.

Column, 9, lines 16, 18, 51 and 60, change "polyorystalline" to --polycrystalline--.

Column 12, line 25, change "firs&" to --first--.

UNITED STATES PATENT AND TRADEMARK OFFICE
CERTIFICATE OF CORRECTION

PATENT NO. : 5,319,234
DATED : June 7, 1994
INVENTOR(S) : Kimiharu UGA et al.

It is certified that error appears in the above-indentified patent and that said Letters Patent is hereby corrected as shown below:

Column 15, line 40, change "polyorystalline" to --polycrystalline--.

Column 15, lines 42 and 32, change "third, fourth, seventh and ninth" to --fifth, sixth, eighth and tenth--.

Column 15, lines 48-49, change "polyorystalline" to --polycrystalline--.

Signed and Sealed this

Sixteenth Day of January, 1996

Attest:

BRUCE LEHMAN

*Attesting Officer*   Commissioner of Patents and Trademarks